(12) United States Patent
Konstantinov

(10) Patent No.: US 9,099,517 B2
(45) Date of Patent: Aug. 4, 2015

(54) BIPOLAR JUNCTION TRANSISTOR WITH SPACER LAYER

(71) Applicant: Fairchild Semiconductor Corporation, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/048,940

(22) Filed: Oct. 8, 2013

(65) Prior Publication Data

US 2014/0034968 A1   Feb. 6, 2014

Related U.S. Application Data

(63) Continuation of application No. PCT/EP2012/050728, filed on Jan. 18, 2012.

(51) Int. Cl.
| | |
|---|---|
| *H01L 29/73* | (2006.01) |
| *H01L 29/66* | (2006.01) |
| *H01L 29/732* | (2006.01) |
| *H01L 29/10* | (2006.01) |
| *H01L 29/16* | (2006.01) |
| *H01L 29/04* | (2006.01) |
| *H01L 29/06* | (2006.01) |
| *H01L 29/08* | (2006.01) |

(52) U.S. Cl.
CPC ............ *H01L 29/73* (2013.01); *H01L 29/1004* (2013.01); *H01L 29/1608* (2013.01); *H01L 29/66068* (2013.01); *H01L 29/7325* (2013.01); *H01L 29/045* (2013.01); *H01L 29/0692* (2013.01); *H01L 29/0821* (2013.01)

(58) Field of Classification Search
USPC .......................................................... 257/77
See application file for complete search history.

(56) References Cited

U.S. PATENT DOCUMENTS

| | | | |
|---|---|---|---|
| 4,945,394 A | | 7/1990 | Palmour et al. |
| 6,514,779 B1 * | | 2/2003 | Ryu et al. .......................... 438/17 |

(Continued)

FOREIGN PATENT DOCUMENTS

| | | |
|---|---|---|
| EP | 2192211 A1 | 6/2010 |
| EP | 2325872 A1 | 5/2011 |

(Continued)

OTHER PUBLICATIONS

Burke et. al., "Implantation-Free 4H-SiC Bipolar Junction Transistors with Double Base Epi-layers", United States Army RDECOM-TARDEC; TACOM/TARDEC; 17113RC; May 14, 2007, 14 pages.*

(Continued)

*Primary Examiner* — Jarrett Stark
*Assistant Examiner* — Charles N Ausar-El
(74) *Attorney, Agent, or Firm* — Brake Hughes Bellermann LLP

(57) ABSTRACT

New designs for silicon carbide (SiC) bipolar junction transistors (BJTs) and new methods of manufacturing such SiC BJTs are described. The SiC BJT comprises a collector region, a base region and an emitter region disposed as a stack, the emitter region and part of the base region forming a mesa. The intrinsic part of the base region includes a first portion having a first doping concentration and a second portion having a second doping concentration lower than the first doping concentration. Further, the second portion is vertically disposed between the first portion and the emitter region in the stack.

22 Claims, 7 Drawing Sheets

(56) References Cited

U.S. PATENT DOCUMENTS

| | | | |
|---|---|---|---|
| 6,764,907 B2* | 7/2004 | Van Zeghbroeck et al. | 438/270 |
| 7,368,765 B1* | 5/2008 | Rajavel et al. | 257/198 |
| 7,547,578 B2* | 6/2009 | Agarwal et al. | 438/113 |
| 7,569,872 B1* | 8/2009 | Rajavel et al. | 257/198 |
| 8,378,390 B2* | 2/2013 | Domeij | 257/197 |
| 8,785,945 B2* | 7/2014 | Konstantinov | 257/77 |
| 8,829,533 B2* | 9/2014 | Domeij | 257/77 |
| 2004/0082191 A1 | 4/2004 | Zeghbroeck et al. | |
| 2007/0117336 A1* | 5/2007 | Sumakeris et al. | 438/369 |
| 2009/0121319 A1 | 5/2009 | Zhang et al. | |
| 2010/0032685 A1* | 2/2010 | Zhang et al. | 257/77 |
| 2010/0184279 A1* | 7/2010 | Wuu et al. | 438/493 |
| 2011/0095398 A1 | 4/2011 | Nonaka et al. | |
| 2012/0018737 A1 | 1/2012 | Zhang et al. | |
| 2012/0292636 A1* | 11/2012 | Zhang et al. | 257/77 |
| 2013/0187173 A1* | 7/2013 | Domeij et al. | 257/77 |

FOREIGN PATENT DOCUMENTS

| | | | |
|---|---|---|---|
| WO | WO2011120979 A1 * | 10/2011 | |
| WO | 2013/107508 A1 | 7/2013 | |

OTHER PUBLICATIONS

Ghandi, Reza et al., "Surface-Passivation Effects on the Performance of 4H-SiC BJTs", IEEE Transactions on Electron Devices, vol. 58, No. 1, Jan. 2011, 7 pages.

Zhang, Jianhui et al., "Implantation-Free 4H-SiC Bipolar Junction Transistors with Double Base Epilayers", IEEE Electron Device Letters, vol. 29, No. 5, May 2008, 3 pages.

International Search Report for International Application No. PCT/EP2012/050728, mailed Apr. 23, 2012, 5 pages.

Written Opinion of the International Searching Authority for International Application No. PCT/EP2012/050728, mailed Apr. 23, 2012, 8 pages.

Written Opinion of the International Preliminary Examining Authority for International Application No. PCT/EP2012/050728, mailed Dec. 17, 2013, 5 pages.

International Preliminary Report on Patentability for International Application No. PCT/EP2012/050728, mailed Mar. 14, 2014, 7 pages.

Response to Written Opinion for International Application No. PCT/EP2012/050728, dated Dec. 18, 2012, 17 pages.

* cited by examiner

BIPOLAR JUNCTION TRANSISTOR WITH SPACER LAYER

CROSS REFERENCE TO RELATED APPLICATION

This application is a continuation of PCT Patent Application No. PCT/EP2012/050728, filed on Jan. 18, 2012, which is incorporated herein by reference in its entirety.

FIELD

The present disclosure relates to the field of high power semiconductor device technology and in particular to silicon carbide bipolar junction transistors. The present disclosure relates also to methods of manufacturing such high power semiconductor devices.

BACKGROUND

Bipolar junction transistors are often used in switching and amplifying applications. The basic elements of a bipolar junction transistor (BJT) include a collector, a base and an emitter. In such a structure, a first pn junction is formed at the boundary between the collector and the base and a second pn junction is formed at the boundary between the emitter and the base. The emitter and the collector are of a first conductivity type and the base is of a second conductivity type opposite to the first conductivity type.

In a high power BJT, the critical characteristics representative of the performance of the BJT are the common emitter current gain, the specific on-resistance and the blocking voltage.

Most of silicon BJTs can be manufactured using either dopant diffusion or dopant implantation, or the combination of both techniques in order to form the collector, the base and the emitter. In materials such as silicon carbide (SiC), however, dopant diffusion rates are very low and ion implantation create damage which cannot entirely be removed even at the highest available annealing temperatures. There are therefore some limitations on the processes available for manufacturing BJTs in such materials. Consequently, SiC BJTs are usually based on epitaxial designs, at least for the most critical regions of the BJT, such as the emitter and the intrinsic base. Such epitaxial designs result in a vertical topology with the collector, the base and the emitter disposed on top of each other as a stack. In such epitaxial designs, the emitter and the base are defined by etching, thereby resulting in a mesa on top of the structure. The intrinsic base corresponds to the part of the base directly located under the emitter, i.e. the part of the base interfacing the emitter.

High power BJTs in SiC are expected to provide a high blocking voltage, a low on-state voltage drop and a high emitter current gain. These parameters are, however, difficult to achieve simultaneously. Further, conventional designs and manufacturing methods are still limited with respect to reproducibility, which is a drawback for scalable commercial manufacture of such devices.

Thus, there is a need for providing new designs of high power semiconductor devices, in particular SiC BJTs, and new methods of manufacturing such high power semiconductor devices that would alleviate at least some of the above-mentioned drawbacks.

SUMMARY

At least some of the embodiments of the present disclosure alleviate at least some of the above disadvantages and drawbacks of the prior art and provide an improved alternative to the design and manufacture of SiC BJTs.

Generally, at least some of the embodiments provide a SiC BJT whose design improves manufacturing reproducibility. Further, the present disclosure is related to methods of manufacturing such a SiC BJT.

Many advantages are achieved by using a SiC BJT, a unit cell of a power semiconductor device and a method of manufacturing a SiC BJT as described herein.

BRIEF DESCRIPTION OF THE DRAWINGS

The above, as well as additional features and advantages of the embodiments, will be better understood through the following illustrative and non-limiting detailed description, with reference to the appended drawings, in which.

Figure 1:
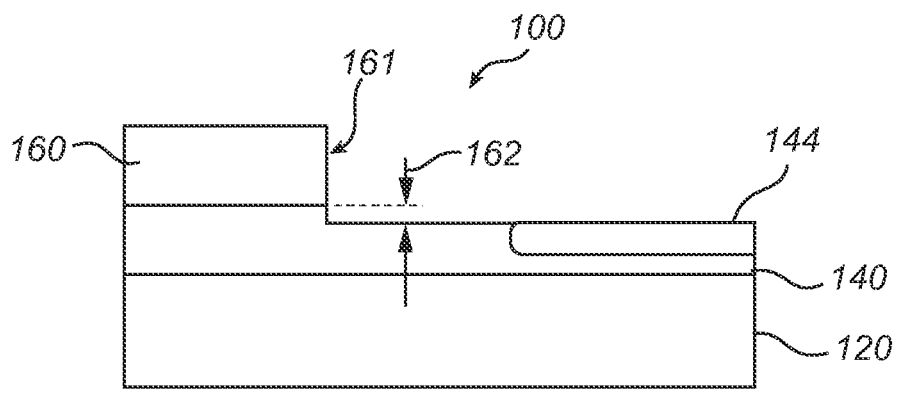
FIG. 1 shows a schematic cross-sectional view of a standard SiC BJT.

All the figures are schematic, not necessarily to scale, and generally only show parts to elucidate the embodiments, wherein other parts may be omitted or merely suggested.

DETAILED DESCRIPTION

According to a first aspect of the present disclosure, there is provided a bipolar junction transistor (BJT) in silicon carbide (SiC). The SiC BJT comprises a drift region, a base region, and an emitter region being disposed as a stack. The emitter region and part of the base region form a mesa. Further, the intrinsic part of the base region includes a first portion having a first doping concentration and a second portion having a second doping concentration lower than the first doping concentration. The second portion is vertically arranged between the first portion and the emitter region in the stack.

According to a second aspect of the present disclosure, a unit cell of a power semiconductor device is provided. The unit cell comprises a first region having a first conductivity type, a second region having a second conductivity type opposite to the first conductivity type, and a third region having the first conductivity type. The second region comprises a first portion having a first doping concentration and a second portion having a second doping concentration lower than the first doping concentration. The second portion is vertically arranged on top of the first portion and the first, second and third regions are disposed as a stack, the third region and part of the second region forming a mesa.

According to a third aspect of the present disclosure, there is provided a method of manufacturing a SiC BJT. The method includes forming a collector layer having a first conductivity type, forming a first layer of a base layer having a second conductivity type opposite to the first conductivity type and forming a second layer on the first layer of the base layer. The first layer is disposed on the collector layer and has a first doping concentration which is higher than a second doping concentration of the second layer. Further, the method includes the steps of forming an emitter layer disposed on the second layer of the base layer and forming a mesa in the emitter layer and at least part of the base layer. The emitter layer has the first conductivity type.

The embodiments make use of an understanding that the doping level in the base region of a BJT (or the doping level in a region of a unit cell of a power semiconductor device located between two other regions having a different conductivity type) may be selected or configured such that a portion of the base region (the second portion) acts as a spacer (or spacing layer/means) between the emitter region and the remaining part of the base region (in particular the first portion having a higher doping than the second portion). The second portion of the base region is arranged next to (or more specifically adjacent to) the emitter region and has a doping concentration lower than a doping concentration of the first region (or remaining part of the base region) which is arranged next to (or more specifically adjacent to) the drift region (or collector region). In other words, relative to the first portion, the second portion is arranged closer to the emitter region in the stack.

The embodiments are advantageous in that they provides a new design of a silicon carbide power BJT, which new design improves the current gain while maintaining a sufficient blocking voltage and a relatively low on-state voltage drop. The base region is provided with a low-high doping profile, wherein a portion of material with a lower doping is disposed next to, or adjacent to, the emitter region and a portion of material with a higher doping is disposed next to, or adjacent to, the drift region.

As compared to prior art approaches in designing BJTs, wherein the topmost portion of the base may be designed with a doping level higher than that of portions located further below the surface of the base, at least some of the embodiments described herein include the base of a SiC BJT (in particular the intrinsic base) that may comprise a portion having a doping concentration which is lower than the doping concentration of a portion which is, in comparison, arranged further away from the emitter region.

With the designs of the embodiments, the control of the amount of dopant in the base layer is improved since the use of the low-doped base portion (the second portion) decreases the dose of dopant (e.g. acceptor charge) that may be removed from the extrinsic base region as a result of mesa formation (for defining the emitter region) via etching.

The design according to the embodiments facilitates manufacture of silicon carbide BJTs having a thin base region and a relatively thick emitter. As a result, a BJT with an improved current gain is obtained. The doping of the low-doped base portion (preferably p-type) suppresses, or at least reduces, the access of minority carriers to the surface and/or the double injection into the near-surface region during device operation. The embodiments are therefore also advantageous in that they improve the stability of the device during operation.

For a forward-biased pn junction, the concentration n of injected electrons in immediate proximity to the emitter region is $n=n_i^2/p_p \times \exp(V_f/kT)$, where $n_i$ is the intrinsic carrier concentration, $p_p$ is the majority carrier (hole) concentration, $V_f$ is the forward bias, k is the Boltzmann constant and T the junction temperature in Kelvin. A too low acceptor concentration in the near-surface region will promote access of minority electrons to the surface states and will therefore result in excessive surface recombination and in a loss (or decrease) in emitter current gain. The embodiments are advantageous in that easy access of injected carriers to the surface is prevented, thereby reducing the risk of potential stability issue due to surface states. Further, it is advantageous to retain a sufficiently high acceptor doping in the spacer region (i.e. the second region) rather than apply an intrinsic doping to this region.

As further explained below in more detail, the present design improves also the reproducibility of the manufacturing process since the upper portion of the base layer includes material having a lower doping concentration than that of the lower portion (with respect to the vertical topology described above, which also corresponds to the direction of epitaxial growth of the layers of the SiC BJT).

The BJT and unit cell of the power semiconductor device can be fabricated using epitaxial growth of SiC for at least the emitter region and the intrinsic part of the base region. The devices may also have fully epitaxial designs. Referring more specifically to the SiC BJT, the collector (or drift) region, the base region and the emitter region may be fabricated using epitaxial growth of a collector layer, a base layer and an emitter layer disposed as a stack (with the base layer vertically arranged between the collector layer and the emitter layer). Devices whose designs can be manufactured by epitaxial growth are advantageous since they provide higher minority carrier lifetimes as compared to BJTs fabricated using ion-implanted emitter or base regions.

Following the epitaxial growth of at least the base and emitter layers, the emitter region may be defined using e.g. an appropriate masking layer and dry plasma etch. Accordingly, a mesa or elevated structure forming the emitter region is obtained on top of the stack of layers, resulting in a vertical topology. In the structure of the BJT or unit cell described above, the embodiments are advantageous in that the second portion acts as a spacer layer or an etching protection layer on top of the structure when forming the emitter mesa (or elevated/raised structure of the emitter region). The emitter mesa on top of the structure may be defined by outer sidewalls or vertical mesa edges.

In such a device, the part of the base layer capped or covered by the emitter region is referred to as the intrinsic part of the base region (or intrinsic or active base) and the part of the base layer uncapped or uncovered by the emitter region is referred to as the extrinsic part of the base region (or extrinsic or passive base). The intrinsic part of the base region laterally extends in the base layer from the mesa edge (or mesa sidewall) under the emitter region while the extrinsic part of the base region laterally extends in the base layer from the mesa edge (or mesa sidewall) in the opposite direction (usually towards a contact zone for electrically contacting the base region).

As will be further explained, the first layer and the second layer of the base region may laterally extend into (or may be part of) the extrinsic base region.

The walls of the mesa preferably extend along the whole thickness of the emitter region and any etch process used for formation of the emitter mesa may then preferably stop at a depth corresponding to the thickness of the emitter layer. However, there does not seem to be any etch stop technique available today to ensure termination of the etch process exactly after removal of the emitter layer from the regions that are desired to form the extrinsic base, i.e. the part of the base layer uncovered by the emitter layer. Further, there may be some deviation of the actual emitter thickness from a target value and some variation of the thickness of the emitter layer over the wafer surface. The process for forming the mesa, i.e. the dry etch process, is also subject to certain run-to-run variations. Conventional manufacturing techniques therefore include a certain amount of overetch of the emitter layer in order to ensure that the emitter layer is completely removed from the intended extrinsic part of the base region. However, an overetch will remove a certain amount of charge from the surface of the extrinsic part of the base region, which is an undesirable effect.

The BJT, according to the embodiments, provides a much wider tolerance to overetch as compared to conventional BJTs having a flat and constant doping of the base region. With a base region including a second portion of low doping disposed over a first portion of high doping, any overetch of the emitter layer will first remove material from the second portion having the lower doping before removing material from the first portion having the higher doping. The charge removed from the base region of the BJT may be K times lower than that for a conventional device, where K is the ratio of acceptor doping levels (for the case of a p-type base layer) in the first and second portions (i.e. high and low-doped base layers). The term K may be expressed as $K=N_{hi}/N_{lo}$ wherein $N_{hi}$ and $N_{lo}$ are the non-compensated acceptor concentration in the high-doped portion (i.e. the first portion using the above terminology) and in the low-doped portion (i.e. the second portion) of the base region, respectively.

According to an embodiment, the first portion may be part of a first layer of the base region and the second portion may be part of a second layer of the base region, the second layer being vertically arranged closer to the emitter region relative to the first layer. In the present embodiment, the first and second portions may be obtained via successive epitaxial growth of a first layer having the first doping concentration and a second layer having the second doping concentration. The present embodiment provides for an easy implementation with two layers. In other words, a double layer base region is provided in the present embodiment, wherein the layer being arranged closest to the emitter region has a lower doping than the layer arranged closest to the drift region.

According to another embodiment, the base region may have a doping level decreasing in a graded manner (e.g. linearly but not necessarily) or a stepwise manner along a direction from the drift region to the emitter region. In the present embodiment, the doping profile is not specifically associated with two layers of the base region but, instead, the doping level gradually varies within the base layer. Such a layer may be provided by adjusting the parameters of the epitaxy during growth of the layer, e.g. by gradually decreasing the arrival of dopant atoms in the epitaxy chamber. In the present embodiment, a layer arranged closer to the emitter region has a lower doping than a layer arranged closer to the drift region.

According to an embodiment, the second portion may be thinner than the first portion, which is advantageous in that the operational function of the base region is mainly supported by the first portion (having a higher doping). In particular, the thickness of the second portion of the base region may approximately be 30 to 500 nanometers (nm), and preferably between about 100 and 300 nm. As will be further explained below, the thickness of the second portion of the base region may be chosen depending on the precision of the available manufacturing processes.

According to an embodiment, the second doping concentration is, at most, 50% of the first doping concentration. In particular, the second doping concentration may have a value corresponding to about 5% to 25% of the first doping concentration. Referring to the above definition of the term K, the value of K is preferably higher than 2, and, most preferably between 4 and 20.

For example, the doping concentration of the second portion may be equal or less than about $5 \times 10^{17}$ $cm^{-3}$. Further, the doping concentration (or acceptor charge in the case of a p-type base region) of the second portion may advantageously be less than the doping concentration (or acceptor charge) in the first portion.

The thickness and the doping level of the second portion of the base region may be selected depending on the available processes and the precision of these processes, in particular, the epitaxial growth of the emitter layer and the etching process for forming the mesa. An increased precision may for instance allow a thinner second portion as the amount of overetch would then be reduced.

According to an embodiment, the thickness of the emitter region may be about 0.3-3 micrometers (μm), and preferably at least 1 μm. In particular, the emitter region may advantageously be thicker than the base region. The present embodiment is advantageous in that an increased thickness of the emitter region provides an increase in emitter current gain.

As mentioned above, the mesa may include a sidewall. Depending on the etching process, such sidewall may be a sloped sidewall. The use of a sloped sidewall, which may for example include a stair-like profile, is advantageous in that it may reduce the formation of a trench at the intersection between the mesa and the surface of the structure (i.e. the location at which the sidewall terminates). Reducing the formation of trenching, or providing a sloped sidewall free of trenching, is advantageous in that it reduces punch-through (i.e. electrical breakdown) at the base of the device.

The sidewall may extend at least partly into the second portion and, advantageously, may terminate within the second portion. It will be appreciated, however, that the some embodiments are advantageous even if the sidewall of the emitter mesa extends through the whole thickness of the second portion and reaches the first portion. In any case, as compared to prior art BJTs, the second portion or spacing layer still reduces the risk of removing a significant amount of dopant from the extrinsic part of the base layer.

According to an embodiment, the total dose of the base region may be about $2\text{-}4 \times 10^{13}$ $cm^{-2}$, which is advantageous in that it provides a sufficient breakdown voltage. In the present embodiment, the total dose corresponds to the sum of the contribution from the first portion and the second portion. As the required thickness and doping level of the second portion may also depend on the available processes and their respective precisions, the thickness and doping level of the first portion may be calculated accordingly.

The emitter region and the drift region may have a first conductivity type, preferably n-type, and the base region may have a second conductivity type, preferably p-type, opposite to the first conductivity type, thereby providing a vertical npn bipolar junction transistor, which is the most common type of SiC BJT.

The second portion may extend laterally towards a contact zone for contacting the base region. In other words, the second portion (and actually the first portion too) need not be laterally confined to the intrinsic base region. The extrinsic base of the BJT may in particular be fully "capped" by the low-doped base portion (the second portion), at least in the vicinity of the emitter mesa edge. In other words, the second portion may extend at least partly within the extrinsic part of the base region. For the purpose of partial extension of the second portion in the extrinsic part of the base region, the BJT may further comprise an additional sidewall in the second portion. The additional sidewall may be laterally spaced away from the sidewall of the mesa (for example by a few micrometers). An ion-implanted region may then be provided in the part of the extrinsic base region not being capped by the second portion, thereby directly contacting the first portion.

According to an embodiment, the emitter region, the base region and the drift region may be arranged on a substrate having an off-axis orientation of about 4 degrees or lower. In the present embodiment, the BJT may advantageously further comprise a defect termination layer (DTL) arranged between the substrate and the drift region for terminating basal plane dislocations in the DTL and for reducing growth of defects from the DTL to the drift region. In particular, the doping level of the DTL may be comprised in the range of about $3 \times 10^{18}$ to $2 \times 10^{19}$ cm$^{-3}$. Further details about the DTL and this embodiment will be provided in the following detailed description. Such embodiments are advantageous in that they prevent, or at least reduce, bipolar degradation of the device.

According to an embodiment, the BJT may comprise an ion-implanted region laterally spaced away from a sidewall of the mesa for providing a contact zone to the base region. The ion-implanted region may then advantageously have a penetration depth exceeding the thickness of the second portion, thereby contacting the first portion having a higher doping concentration than the doping concentration of the second portion. An improved Ohmic contact is then achieved. The Ohmic contact may preferably be arranged at a distance of a few microns from the emitter mesa edge. A too narrow spacing (e.g. narrower than a few microns) between the emitter mesa edge and the ion-implanted region may result in a drop of current gain due to capturing of the injected electrons by the recombination centers caused by ion-induced damage. More specifically, the lateral spacing between the implanted region and the sidewall may be at least two micrometers and preferably between about three and five micrometers.

According to an embodiment, there is provided a power device comprising a plurality of BJTs as defined in any one of the preceding embodiments, the BJTs being arranged as a one- or two-dimensional array and being connected to each other via an interconnect (e.g., interconnecting means). Advantageously, the array may be (fully) surrounded by a high-voltage termination region and a minimum distance between such termination region and the nearest emitter mesa may be at least 1.5 times the thickness of the drift layer (or low-doped collector layer).

Referring now more specifically to the embodiment corresponding to the second aspect described above, it will be appreciated that the first region, the second region and the third region may include a wide bandgap semiconductor, preferably silicon carbide (SiC). SiC is advantageous in that it presents a high breakdown electric field, a high thermal conductivity and a high saturated drift velocity of electrons. SiC is a wide bandgap semiconductor and may advantageously be used for manufacturing devices for high power, high temperature and high frequency applications. SiC BJTs are examples of high-performance power devices having low on-state and switching losses and being capable of high-temperature operation.

Referring now more specifically to the third aspect, according to an embodiment, at least some of the steps of forming layers may include epitaxial growth of SiC.

According to another embodiment, the forming of the mesa may include forming a masking layer disposed on the emitter layer, patterning the masking layer, and etching the emitter layer and the second layer of the base layer.

It will be appreciated that the embodiments described above in connection to the first aspect are also combinable with any of the embodiments described in connection with the unit cell of a power semiconductor device according to the second aspect and the manufacturing method of the third aspect, and vice versa.

Further features of, and advantages with, the embodiments described herein will become apparent when studying the following detailed disclosure, the drawings and the appended claims. Those skilled in the art will realize that different features can be combined to create embodiments other than those described in the following.

With reference to FIG. 1, there is shown a schematic view of a standard SiC BJT.

FIG. 1 shows a SiC BJT 100 comprising a collector region (or collector layer) 120, a base region (or base layer) 140 and an emitter region (or emitter layer) 160. These regions or layers 120, 140 and 160 may be grown by epitaxy on a substrate (not shown), thereby resulting in a stack of layers. The layers are grown on top of each other and, in the following, the direction of epitaxial growth may also be referred to as the vertical direction. In the case of a NPN SiC BJT, the epitaxial structure may comprise a low-doped n-type collector layer 120, a p-type base layer 140 and a highly doped n-type emitter layer 160. The substrate may then be a highly doped n-type substrate. After epitaxial growth, the emitter region and the base region are defined using dry etch techniques, thereby providing an elevated emitter region or mesa 160 comprising a sidewall 161 vertically extending through the emitter layer and part of the base layer 140.

Ohmic contacts (not shown) may be formed to the emitter region 160, the base region 140 and the collector region 120. The Ohmic contact to the base region 140 may be improved by providing a region 142 having an increased acceptor doping using e.g. selective ion implantation followed by a subsequent high-temperature anneal before forming the metal contact. The collector Ohmic contact may be formed at the back side of a substrate on which the emitter region 160, the base region 140 and the collector region 120 are disposed.

The portion of the base layer 140 located under the emitter mesa 160, i.e. within the outline of the emitter edges, is conventionally referred to as the intrinsic base region while the portion of the base layer 140 not capped with the emitter region 160 is conventionally referred to as the extrinsic base region.

As already explained above and as further illustrated in FIG. 1, forming the emitter mesa includes an overetch as represented by the distance denoted 162 in FIG. 1 in order to ensure that the emitter layer is completely removed from the extrinsic base region, thereby removing part of the base layer, and in particular part of the extrinsic base region. Such an overetch 162 removes a certain amount of charge from the surface of the extrinsic base region, which is undesirable.

Figure 2:
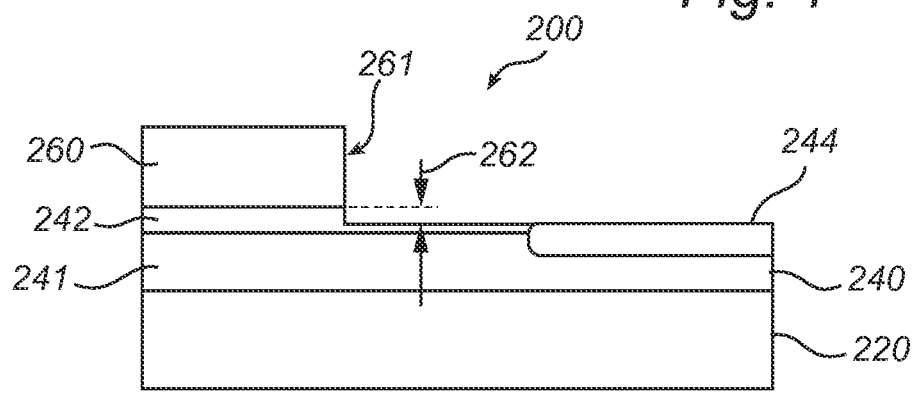
FIG. 2 shows a schematic cross-sectional view of a SiC BJT in accordance with an exemplifying embodiment.

With reference to FIG. 2, there is shown a schematic view of a SiC BJT in accordance with an embodiment.

FIG. 2 shows a SiC BJT 200 comprising a collector region 220, a base region 240 and an emitter region 260. The SiC BJT 200 shown in FIG. 2 is equivalent to the SiC BJT 100 described with reference to FIG. 1 except that the base region comprises a first portion 241 having a first doping concentration and a second portion 242 having a second doping concentration lower than the first doping concentration. The second portion 242 is vertically arranged between the first portion 241 and the emitter region 260 in the stack.

Referring to e.g. FIG. 1, common BJT designs comprise a base region 140 in which the doping level is constant or may continuously decrease from the emitter region 160 towards the collector region 120. Such a doping profile provides a built-in electric field in the base region 140 for dragging minority carriers towards the collector region 120.

Referring now again to FIG. 2, it will be appreciated that the doping profile of the base region 240 is contrary to what is known in the prior art. In accordance with some embodiments, a first portion 241 of the base region 240 has a doping concentration which is higher than the doping concentration of a second portion 242 of the base region 240 located closer to the emitter region 260. In the example shown in FIG. 2, the base region comprises two layers 241 and 242, with the first layer 241 having a first doping concentration and the second layer 242 having a second doping concentration lower than the first doping concentration. However, it will be appreciated that the doping profile of the base region 240, i.e. the variations in doping levels within the base region 240, may be provided differently than with two separately grown epitaxial layers 241 and 242. The required doping profile may be provided by gradually (and continuously) varying the doping level within a single layer of the base region 240, wherein the portion of the base region 240 located closest to the emitter region 260 has a doping concentration being lower than the doping concentration of the region of the base region located closest to the collector region 220 (in other words with a doping concentration decreasing along a direction from the collector region towards the emitter region). Any overetch of the emitter region 260, as represented by the distance denoted 262 in FIG. 2, which may be inevitable depending on the control of the available manufacturing processes, in the BJT 200 removes a lower acceptor charge than what the corresponding overetch 162 would remove in a conventional BJT 100.

As illustrated in more detail by the following simulation results, the inventor has recognized that such kind of doping profile in the base region, i.e. with a step in acceptor concentration at the boundary of high and low-doped layers 241 and 242, does not affect the current gain. The simulations were performed using a conventional two-dimensional TCAD (Technology CAD) program. The simulation results illustrate the advantages of the design according to the embodiment shown in FIG. 2.

Figure 3:
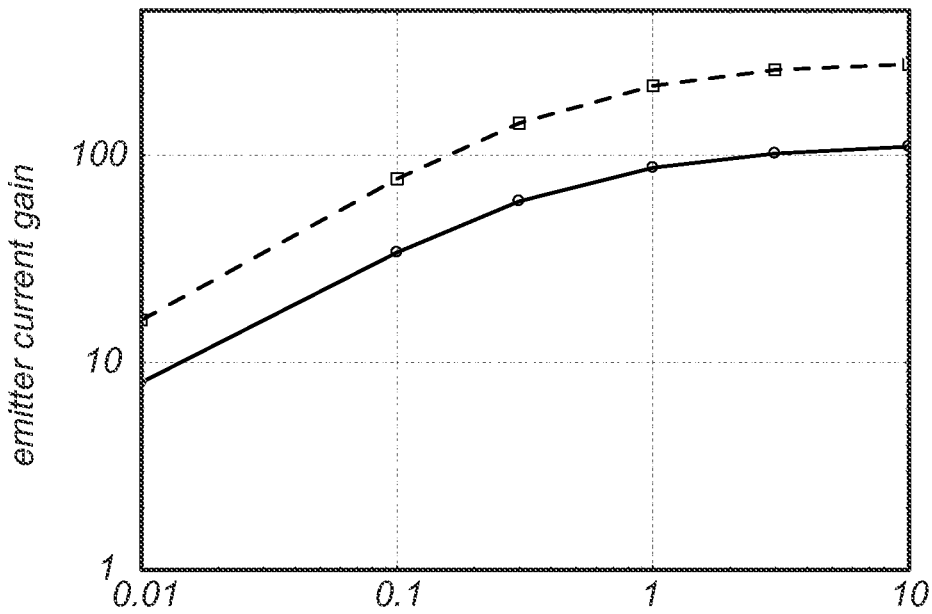
FIG. 3 illustrates the emitter current gain of two SiC BJTs having a base thickness of 300 nm and 700 nm as a function of carrier lifetime (at a collector current density of 200 A/cm$^2$)

FIG. 3 shows the dependence of emitter current gain (ECG) of a conventional BJT having a flat doping in the base region on minority carrier lifetimes parameters of the Shockley-Read-Hall (SRH) recombination statistics. The graph of FIG. 3 shows the result for a BJT having a base thickness of 300 nm (dashed line) and 700 nm (continuous line). The SRH lifetimes are assumed to be concentration dependent starting from a characteristic concentration of $5 \times 10^{16}$ cm$^{-3}$, $\tau_{N0} = \tau_{P0} = \tau_0/(N+N_0)$, where $\tau_{N0}$ and $\tau_{P0}$ are the lifetimes of the SRH statistics, $N_0 = 5 \times 10^{16}$ cm$^{-3}$, $\tau_0$ is the SRH lifetime in a low-doped material, and N is the total dopant concentration. The lifetime $\tau_0$ is varied within a wide range from 10 ns to 10 μs. The simulations are performed for two BJTs differing from each other in that a first BJT has a base region with a thickness of 300 nm and a second BJT has a base region with a thickness of 700 nm, both BJTs having a fixed dose of acceptors in the base region, namely $Q_B = 2.5 \times 10^{13}$ cm$^{-2}$. All other parameters of the first and second BJTs are otherwise identical. The BJTs feature a 1 μm thick emitter region with a doping of $5 \times 10^{18}$ cm$^{-3}$ and a 10 μm thick low-doped collector layer with a doping of $9 \times 10^{15}$ cm$^{-3}$. These parameters are approximately the thicknesses and doping levels that are required for blocking a voltage of about 1500-1600V with minimum resistance of the collector layer under on-state conditions. The minimum base dose $Q_{B,min}$ is defined by the Gauss Law, $Q_{B,min} = \in \in_0 E_{br}/q$, where $E_{br}$ is the avalanche breakdown field in SiC (2.2-2.8 MV/cm), $\in_0$ is the dielectric constant and $\in$ is the permittivity of SiC. The BJT design may be improved or optimized using a base dose that is higher than $Q_{B,min}$. All simulations are done for a temperature of 300° K and all the simulated numbers of ECG shown in FIG. 3 are obtained for a current density of 200 A/cm$^2$. The effects of emitter bandgap narrowing are taken into account in this and further simulations, as well as incomplete ionization of the base acceptors. The width of both emitter and base stripes is set to 20 μm for all the simulations.

According to classical theory of bipolar transistors, the emitter current gain (ECG) is mainly dependent on the ratio of Gummel numbers for emitter and base, $Q_E$ and $Q_B$. The maximum current gain of an npn transistor is approximately the ratio of $D_e Q_E/Q_B D_h$, where $D_e$ and $D_h$ are electron and hole diffusion coefficients, respectively. It is clear from the simulation result shown in FIG. 3 that classical considerations do not hold for silicon carbide BJTs.

The ECG of a SiC BJT is approximately in inverse proportional to the base thickness, even though the acceptor dose in the base region is maintained constant, as illustrated in FIG. 3 wherein the ECG of the BJT having a 300 nm thick base is two to three times higher than that of a BJT having a 700 nm thick base. A large difference in ECG between the BJTs having identical acceptor dose in the base region is maintained for variation of carrier lifetime within three orders of magnitude.

Figure 4:
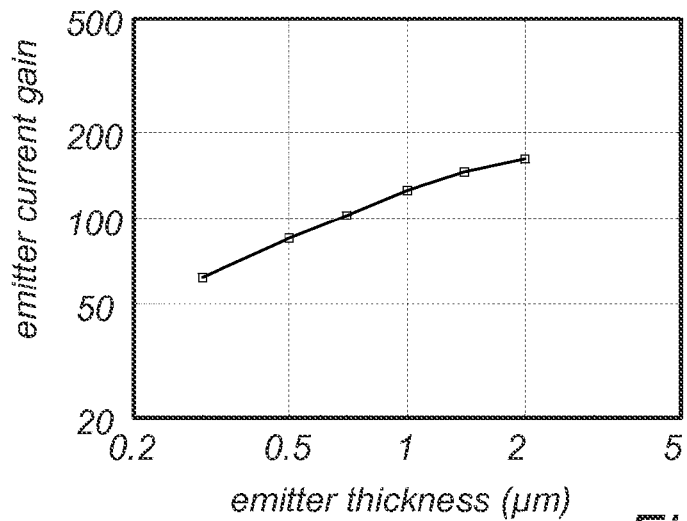
FIG. 4 illustrates the dependence of emitter current gain (ECG) on emitter thickness for two such SiC BJTs (the same as those compared in FIG. 3)

FIG. 4 shows the dependence of ECG on emitter thickness for a BJT having a base thickness of 500 nm. The acceptor dose is the same as that for the simulation performed for the devices described in connection to FIG. 3, i.e. $Q_B = 2.5 \times 10^{13}$ cm$^{-2}$. From the result shown in FIG. 4, a thick emitter or increase in emitter thickness appears to be another advantage from the viewpoint of optimizing the ECG. An increase in ECG may be obtained by increasing the thickness of the emitter region. In particular, the emitter region may be thicker than the base region.

Figure 5:
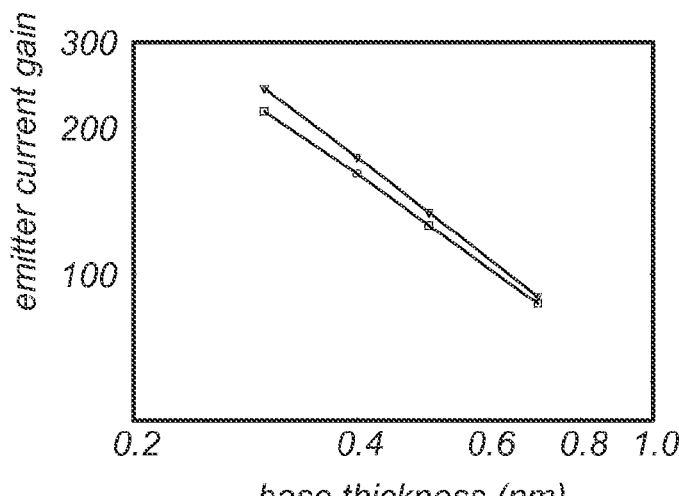
FIG. 5 shows the dependence of ECG on the base thickness for a BJT having a conventional design (i.e. with a flat-doped base layer) and for a BJT according to an embodiment (i.e. with a low-high doped base region)

FIG. 5 shows simulation results illustrating the dependence of the ECG on the base thickness for a BJT having a standard design such as shown in FIG. 1 (result corresponding to the lower line/curve on the graph of FIG. 5) and a BJT having a design according to an embodiment such as shown in FIG. 2 (result corresponding to the upper line/curve on the graph of FIG. 5). In the present comparison, both simulations assume a zero overetch of the emitter mesa, and parameters of the emitter region and the collector region are the same as those described above in connection to FIG. 3. The low-concentration SRH carrier lifetime $\tau_0$, i.e. the carrier lifetime in the second portion of the base region, is set to 1 µs. The BJTs have a base acceptor dose of $2.5 \times 10^{13}$ cm$^{-2}$, an emitter thickness of 1 µm and an emitter doping of $5 \times 10^{18}$ cm$^{-3}$. The BJTs having the improved doping profile (i.e. with the first and second portions having different doping levels, or low-high doping profile, as defined with reference to e.g. FIG. 2) of the base region are in the present example assumed to have an identical low-doped portion, i.e. identical second portion 242, of the base region 240. The second (low-doped) portion 242 adjacent to the emitter region 260 is set to be 100 nm thick and doped to $1 \times 10^{17}$ cm$^{-3}$. The doping level of the first (high-doped) portion 241 of the base region 240 is then adjusted to provide a total acceptor dose of $2.5 \times 10^{13}$ cm$^{-2}$ in the base region 240 for all the simulated devices irrespective of the base thickness. The simulation results show that there is little difference in ECG between a standard BJT and the BJTs having designs in accordance with embodiments. The BJTs having an improved doping profile in the base region in accordance with the embodiments provide a current gain that is close to that obtained for standard BJTs (having flat-doped base regions). The result shown in FIG. 5 further confirms the result presented in connection to FIG. 3, i.e. that the ECG decreases with an increased base thickness even if the base Gummel number is kept constant. The base width is a critical parameter from the viewpoint of ECG, and an increase in current gain may be achieved by decreasing the thickness of the base region and/or by increasing the doping level of the base region.

In the following, in order to illustrate the advantages, some drawbacks of power BJTs in SiC having a conventional "flat" (or constant) base doping are described. For such conventional designs, the precision of the manufacturing processes, and in particular the achievable process tolerances, are factors limiting the manufacturing yield and also the performance of the devices. For example, it is difficult to etch away a thickness of about a micron or a few microns of an emitter layer and stop at the metallurgical base-emitter junction with a precision of an order of magnitude of 10 nm. Even though such a process may be once a success in laboratory production, large-scale manufacturing of such devices is hardly possible with an acceptable yield. Further, the thickness of the epitaxial layer of SiC may also fluctuate from one epitaxial run to another by a number of between a few percent to approximately 10%. The finite precision of dry etch equipments further adds to the variation of the etch depth from a target value. Even if it was possible to measure both the deposition rate and the etch rate with high precision, the non-uniformity of epitaxy over a wafer area would restrict the overall device yield to a low value. A non-uniformity of about 10% in the emitter layer thickness requires the removal (i.e. overetch) of about 200 nm more for an emitter thickness of 2 µm in order to ensure that the emitter layer is correctly removed over the entire surface of the device. Such an extra removal of about 200 nm corresponds to the removal of an acceptor dose of $2 \times 10^{13}$ cm$^{-2}$ from the surface of the extrinsic base at the wafer portions having a thinner emitter layer. On the other hand, an acceptor dose of about $1.4 \times 10^{13}$ cm$^{-2}$ is already sufficient to block the electric field penetration though the base up to the point of avalanche breakdown. Thus, the non-uniformity of the epitaxy alone might require a tradeoff between either (a more substantial) loss of device yield or an increase of the base dose by a factor of 2.4 with (a more significant) loss of current gain as a consequence.

In contrast, the BJT design provides larger process tolerance, thereby ensuring a more reproducible high-yield manufacturing of power BJTs in SiC with a higher current gain, at least higher than for standard devices. Referring e.g. to the device described with reference to FIG. 2, the acceptor charge contained in the second portion 242 (low-doped layer) of the base region 240 represents a minor portion of the total charge (at least less than the acceptor charge in the first portion 241), and the loss of the charge corresponding to this second portion 242 in the extrinsic base due to overetch is a negligible value, even if all or almost all the thickness of the low-doped base layer 242 may be consumed by the overetch. Preferably, the sidewall 261 of the emitter mesa 260 terminates within the second layer 242 of the base region 240, thereby preventing, or at least limiting, any substantial etch into the first portion 241 of the base region 240. For achieving such a result, it will be appreciated that the requirements on tolerance and reproducibility of the processes, such as epitaxial growth and dry etch, are reduced as compared to the requirements for a standard SiC BJT.

Figure 6:
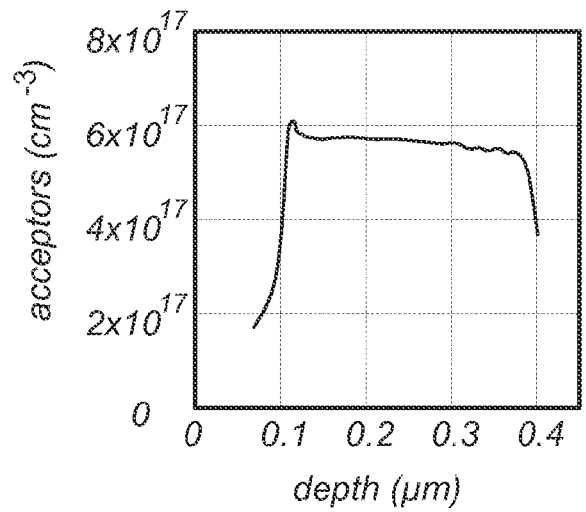
FIG. 6 illustrates the acceptor doping profile extracted from capacitance-voltage measurements performed on a device according to an embodiment.

FIG. 6 shows the base doping profile of a device, as extracted from Capacitance-Voltage measurement data. In the present example, the spacer region or second portion of the base region is approximately 100 nm thick with a doping level of $1 \times 10^{17}$ cm$^{-3}$. The BJT is fabricated on a low-resistivity n-type substrate of 4H (hexagonal) SiC polytype and the substrate is off-oriented 4 degrees off the basal (0001) crystal plane. The off-orientation of the SiC substrate is advantageous for improving the reproduction of the substrate polytype in the epitaxial layers of the BJT. The epitaxial structure featured a 20 µm thick defect termination layer (DTL) that is nitrogen doped to $5 \times 10^{18}$ cm$^{-3}$. The defect termination layer is advantageous for long-term stability of the manufactured device and prevent, or at least limit, bipolar degradation. Details about the DTL layer are further disclosed in International patent application PCT/EP2011/068411 to the same assignee, which application is herein incorporated in its entirety by reference. Referring to the structure shown in e.g. FIG. 2, the epitaxial structure further includes a 10 µm thick low-doped collector layer 220 having a nitrogen doping of $9 \times 10^{15}$ cm$^{-3}$, a 400 nm thick (high-doped) first layer 241 of the base region 240, a 100 nm thick (low-doped) second layer 242 of the base region 240 and a 1000 nm thick emitter region 260 doped to $1 \times 10^{19}$ cm$^{-3}$. The collector layer, the base layers and the emitter layer are sequentially grown by epitaxy on top of the DTL (not shown in FIG. 2).

The emitter and base regions are then defined by plasma etch in order to provide a linear array of 20 µm wide emitter stripes with 20 µm spacing. The emitter mesa etch was targeted to terminate in the middle of the second (low-doped) layer 242 of the base region 240. The emitter mesa 260 may be provided with sloped sidewalls forming an angle of about 45 degrees with the surface of the extrinsic base. Such sidewalls may be manufactured in accordance with the disclosure of WO2011/120979 by Gumaelius, also to the same assignee. The use of sloped-sidewall reduces the formation of trenches at the edge of the emitter mesa, thereby reducing local overetch of the BJT and increasing the blocking voltage. Base mesas may also be provided with sloped sidewalls, such as in the present example, in order to facilitate ion implantation of a Junction Termination Extension (JTE).

As in the present example, a high dose of Al ions may then be implanted into subcontact regions of the extrinsic base in order to facilitate further Ohmic contact formation. The subcontact acceptor ion implant 244 of the component according to the present embodiment is laterally spaced from the emitter edge by 4 µm. The lateral spacing between the sidewall 261 or edge of the emitter mesa 260 and the edge of the subcontact p-implant 244 is advantageous to limit, and preferably avoid, excessive recombination of minority electrons in the extrinsic base. Ion-implanted regions in SiC retain substantial residual ion damage even for the highest available anneal temperatures. Proximity of an ion implant to the emitter edge may deteriorate the emitter current gain and a minimum spacing of 2 µm between the emitter mesa and the ion-implanted region is therefore preferable. A larger spacing may increase the current gain for certain designs, however an extrinsic base having a larger spacing will consume more area without any pronounced decrease of the on-state resistance. These considerations set a practical limit for the spacing between the emitter mesa edge and a subcontact implant to approximately 10 µm.

In the present embodiment, Al ions with a dose of about $1.5 \times 10^{13}$ cm$^{-2}$ are also implanted in a 50 µm wide continuous stripe adjacent to the outer periphery of the base mesa so as to form a junction termination extension (JTE) and to reduce electric field concentration at the BJT periphery under the off-state blocking conditions. The JTE prevents early avalanche breakdown at the device periphery. Other techniques for preventing peripheral breakdown, generally referred to as junction termination, may also be applied instead of JTE.

The BJT wafer is annealed at 1650 C to remove or at least reduce ion damage. A surface recombination suppression (SRS) layer is then formed on the top surface by depositing silicon dioxide and by partially converting it into oxinitride through anneal in $N_2O$ containing atmosphere at around 1200° C. Other materials than nitride oxides may be used. For example, Phosphorous-doped oxides formed by diffusion of phosphorous into a silicon dioxide layer on the surface of SiC may advantageously be used as SRS layers instead of nitride oxides.

Wells in the SRS layer may be opened to form Ohmic contacts to the emitter and base regions. An Ohmic contact may also be provided to the back side of the wafer. A standard 2-layer metallization may then be applied to form low-resistance interconnect of high-power components. Aluminum may be employed as both Level 1 and Level 2 metal, and silicon dioxide may be employed as inter-metal dielectric. Gold metallization may then be applied to the backside of the wafer so as to facilitate further chip bonding into device packages. Further details about the design of the SiC BJT of the present example are presented below.

The Ohmic contacts may be formed by sintering metal layers. Nickel sintering to form nickel silicide may be applied for forming Ohmic contacts to the emitter mesas. A metal stack comprising Al and Ti may be sintered to the base region. After contact sintering, the base contact stack results in the formation of $Ti_3SiC_2$ on the SiC surface, which is a stable high-temperature ceramic material that is lattice-matched to SiC. This compound forms reliable Ohmic contacts to p-type SiC with low contact resistance. A variety of metal stacks may be used for forming $Ti_3SiC_3$ and include for example Al/Ti/Ni, Al/TiGe and Al/Ti/Al. Such metal stacks form a layer of intermetallic alloy on top of the ceramic $Ti_3SiC_2$ layer. Those intermetallic layers are not particularly stable compounds and may potentially be contaminated with oxides upon contact sintering due to residual oxygen in the annealing chamber. It is preferable that the acid-soluble intermetallic compound is removed from the Ohmic contact surface together with the oxide. Standard RCA2 solution (3:1:1 $H_2O:NH_4OH:H_2O_2$) and standard phosphoric etch may be applied for removal of the intermetallic compounds capping $Ti_3SiC_2$. Oxide residues may be removed, for example, by a dip in diluted HF. Masking of the wafer regions outside the p-type Ohmic contact may be performed by applying patterned photoresist. The procedure ensures a clean and thermally stable surface of the base Ohmic contact prior to deposition of Metal 1. It will be appreciated that preparation of clean and stable surface of the base Ohmic contact may also be performed utilizing other chemical solutions, and that dry etch processes may be used instead of wet chemical etch.

It will also be appreciated that the subcontact implant may be bypassed, particularly if the acceptor concentration in the layer to which the contact is sintered exceeds $1 \times 10^{17}$ cm$^{-3}$. Ohmic contacts may then be directly formed to the epitaxial p-type layer without any implanted regions. If the design still include a subcontact implant, contact materials other that $Ti_3SiC_2$ may be applied, such as for example sintering an Al—Ni metal stack. It will be appreciated that a similar procedure as that described above for the base contact may be advantageously applied to the Nickel Silicide contact formed at the emitter layer, which may also have residues of oxidized nickel on top of the nickel silicide. A metal diffusion barrier including e.g. refractory TiW or TiN compound may be applied prior to Metal 1 deposition.

Figure 7:
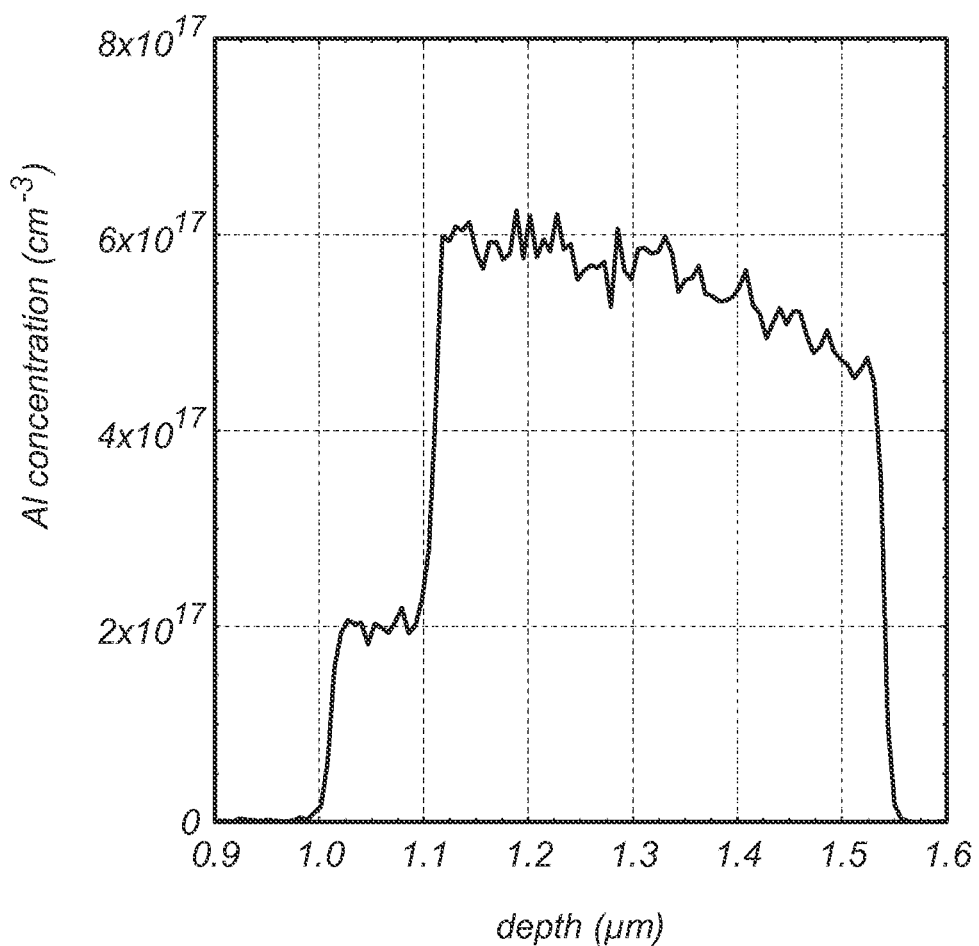
FIG. 7 shows the SIMS profile of the acceptor doping in the device for which the result of capacitance-voltage measurements is shown in FIG. 6.

As shown in FIG. 6, the extracted doping level of the first portion of the base region is about $5.5 \times 10^{17}$ cm$^{-3}$, whereas the second portion is below $2 \times 10^{17}$ cm$^{-3}$. More accurate dopant profiling of the second base portion may not be possible with the Capacitance-Voltage technique. FIG. 7 shows the profile of Al acceptors measured for this wafer using the SIMS (Secondary-Ion Mass Spectroscopy) technique. It will be appreciated that there is a difference in the reference point between the plots shown in FIGS. 6 and 7. The C-V technique extracts the concentration from the width of the depletion region, therefore the zero point corresponds to the bottom of the n+ emitter layer. The SIMS technique determines the profile (and a location in the profile) as a function of the distance from the top of the emitter layer. Therefore the acceptor profiles of FIGS. 6 and 7 are offset by the emitter layer thickness, which is approximately 1 µm.

Figure 8:
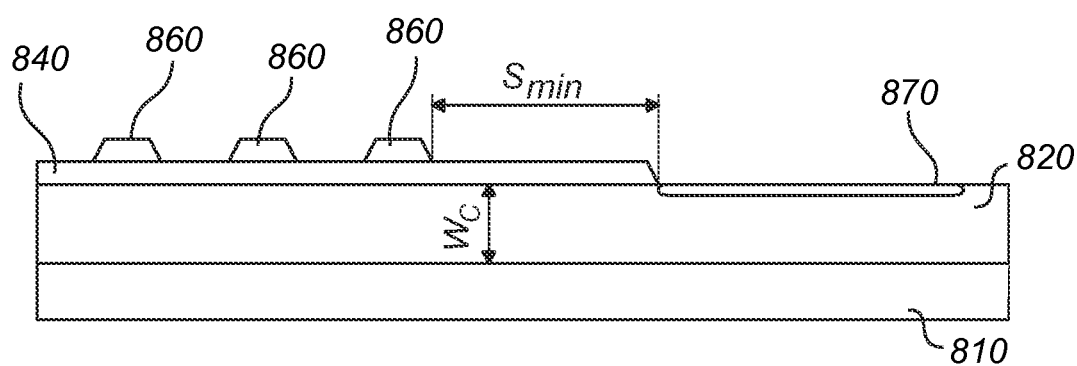
FIG. 8 shows a schematic cross-sectional view of a BJT edge showing a JTE and an edge (or sidewall) of the base mesa (all dielectric and metallic layers being intentionally omitted)

As illustrated in FIG. 8, the power device may comprise a BJT as defined in any one of the preceding embodiments and include a plurality of emitter mesas 860. According to the present embodiment, the power device includes a substrate 810 on which a drift layer or collector layer 820 is disposed. The base layer 840 is disposed on the collector layer 820 and the emitter mesas 860 are defined on top of the structure. The power device further features a spacing between a junction termination 870 (such as a JTE) and the nearest emitter mesa 860 that is greater than two times the thickness $W_C$ of the collector layer, $S_{min} > 2W_C$. Such spacing is advantageous for avoiding, or at least limiting, coupling of bipolar and avalanche multiplication under high voltage operation conditions. Even a near-ideal junction termination has an electric field that is slightly higher than that under the planar portion of the base-to-collector pn junction. If the field concentration region is located in immediate proximity of an emitter mesa, then coupling of bipolar and avalanche gain will result in further decrease of the breakdown voltage. Spacing the emitter mesas away from the base edge by a distance corresponding to at least two thicknesses of the low-doped collector region reduces, or eliminates, the coupling of bipolar and avalanche current gain mechanisms, thereby improving the voltage blocking of the device.

Figure 9:
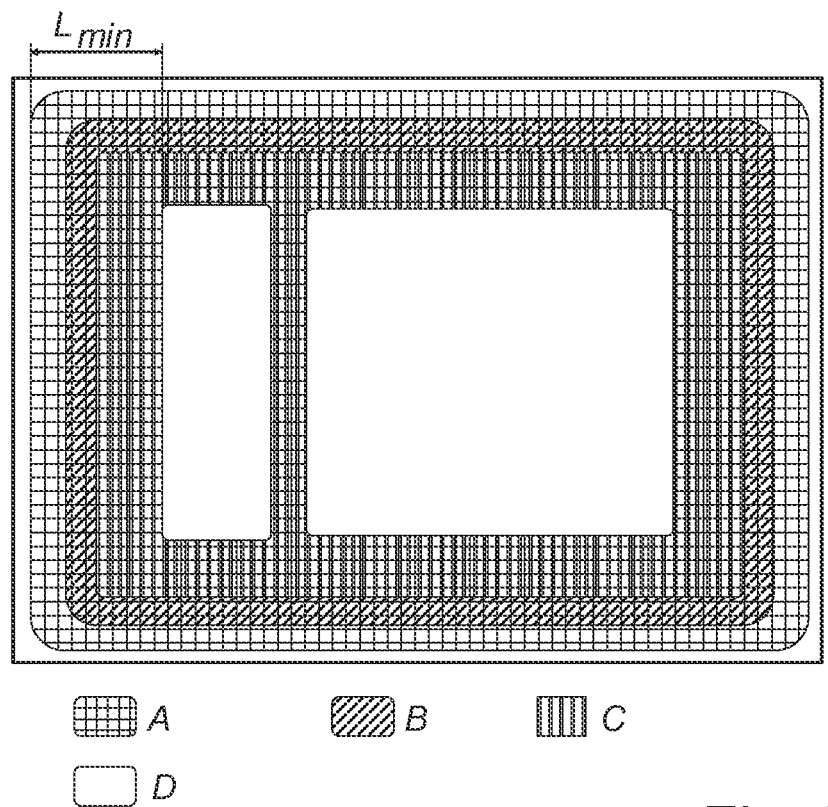
FIG. 9 shows a BJT having extension of the dielectric insulation layer having an extension towards the chip center.

The power device (or BJT) may also be provided with a 4 µm thick dielectric coating of polyimide. The minimum distance between a non-isolated high voltage region and a non-isolated low voltage region on the top of the BJT chip is denoted $L_{min}$ in FIG. 9 and is at least 100 µm per each kilovolt of blocked voltage. Advantageously, the coating may extend a substantial distance over the edge of the BJT mesa in order to maximize the spacing between the chip edge and the high voltage emitter and base contact pads. An increased distance of an isolation layer on top of a SiC BJT decreases the probability for undesirable spark formation in the course of device test and operation. In FIG. 9, regions of the drawing denoted by A represent polyimide, B represent JTE, C represent the base mesa and D represent the base and emitter bonding pads.

Figure 10A:
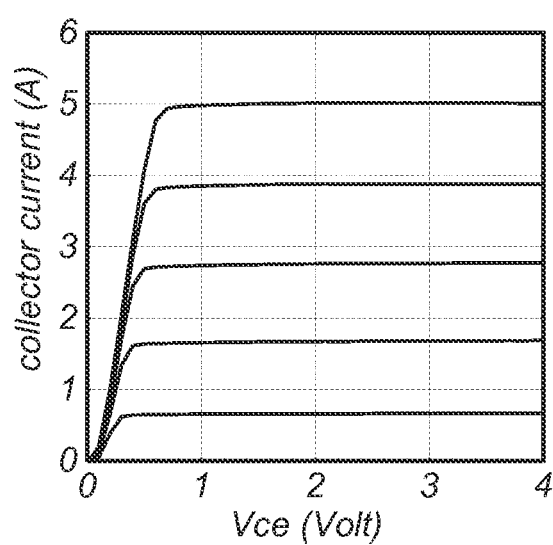
FIG. 10a shows the output characteristics of a BJT manufactured according to an embodiment and FIG. 10b shows the off-state characteristics for the same BJT.
Figure 10B:
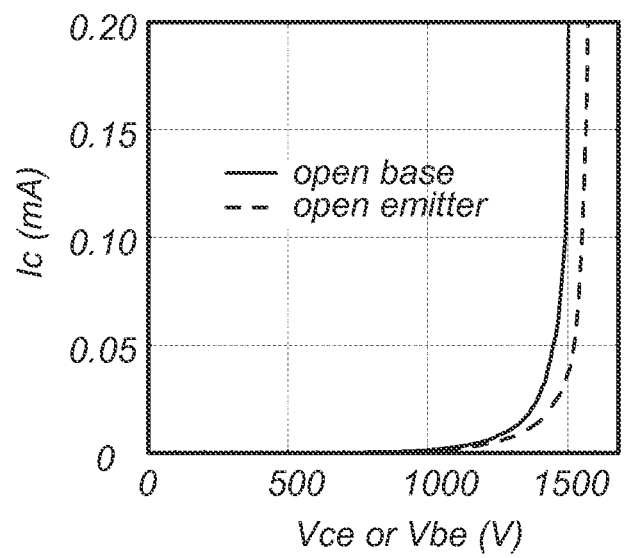

FIGS. 10a and 10b show the output characteristics of the device profiled in FIG. 6 for various base currents increasing in step of 10 mA from 0 mA (the higher the base current, the higher the collector current on the graph). The output characteristics are measured on-wafer. A packaged device will however have an on-state resistance approximately 30-50% lower than that measured on-wafer.

As can be seen in the figures, a high ECG of about 100 may be achieved at a collector current of 5 Amperes. Under the off-state conditions, the BJT blocks 1500 Volts in the open base configuration and a slightly higher voltage in the open emitter configuration, as shown in FIG. 10b (results of blocking test). Further, the majority of high-power BJTs show full long-term stability. In some embodiments, high voltage and high current operation may be simultaneously achieved for the same device. High current gain alone may be achieved through decrease of the base acceptor charge but this would result in a low blocking voltage.

SiC bipolar devices may be prone to so-called bipolar degradation, which is a phenomenon related to growth of stacking faults. Under the conditions of minority carrier injection, BPDs in SiC tend to split into partials forming a stacking fault in between the partials. The stacking faults may propagate though the entire thickness of the low-doped collector layer and partially block the vertical flow of collector current. As already mentioned above, a DTL may be provided between the substrate and the collector region in order to prevent (or at least reduce) bipolar degradation. Potentially unstable devices may be detected via a stress cycle during which manifestations of bipolar degradation in the characteristics of the BJTs are identified. Development of stacking faults due to bipolar degradation in a degraded BJT may for example be accompanied by a pronounced transformation of the output characteristics. As shown in FIG. 10a, the active-region portion of output characteristics of power BJTs in SiC are almost flat and the Early voltage of defect-free SiC BJTs is very high. In contrast, a degraded BJT has a low Early voltage. Thus, an increased output conductance of a BJT is indicative of bipolar degradation.

Figure 11:
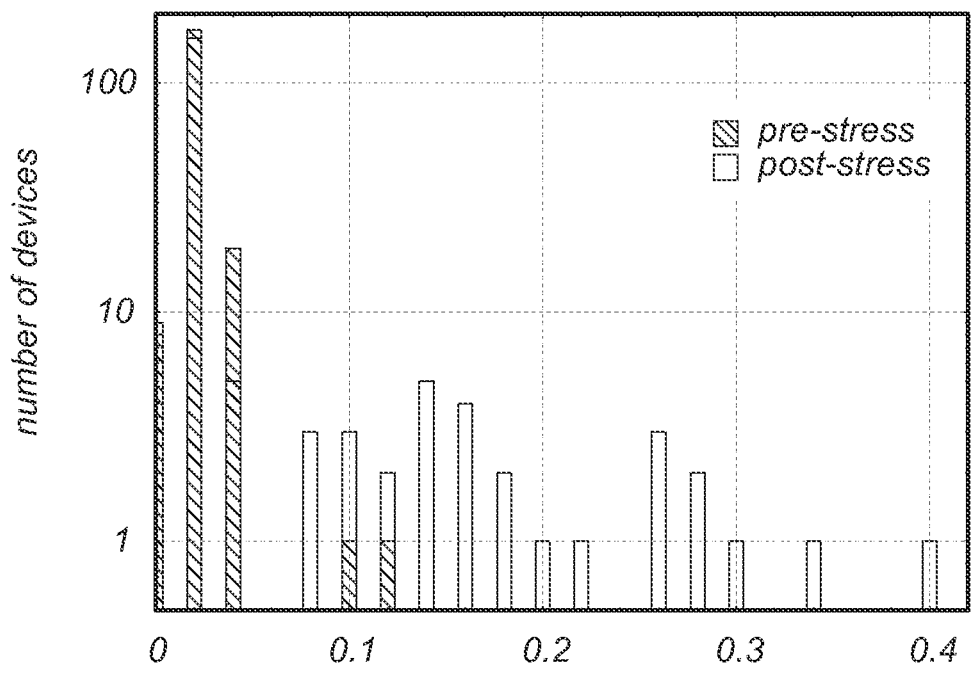
FIG. 11 shows statistics of output conductance for 200 devices (the devices free from stacking faults in the collector region having an output conductance below approximately 0.06 Ohm$^{-1}$)

FIG. 11 shows statistics for two hundred (200) devices manufactured on a SiC wafer before and after base-to-collector forward current stress at a current density of 80 A/cm$^2$ for 30 minutes, which are sufficient conditions to develop degradation in all potentially unstable devices. The output conductance referred to in FIG. 11 is the average number for the collector-emitter bias in interval between 0.8V and 3.8V. As can be seen in FIG. 11, 86% of the 200 devices tested do not have manifestations of bipolar degradation. Such devices have an output characteristics that is close to that shown in FIG. 10a before and after the degradation stress. Degradation-prone devices can therefore be detected at an early stage. The fraction of degraded devices may be further reduced via improvement of substrate quality, through the use of a thicker DTL and/or through optimization of the DTL epitaxial deposition process.

Figure 12:
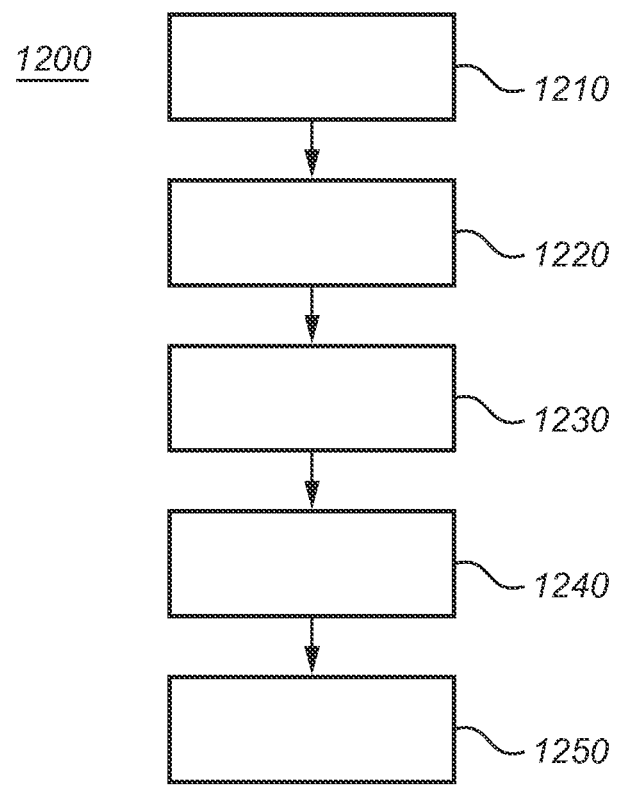
FIG. 12 is a diagram illustrating a manufacturing method according to an embodiment.

FIG. 12 is a general outline illustrating a method of manufacturing a bipolar junction transistor in accordance with an embodiment. Reference is also made to the elements of the BJT 200 shown in FIG. 2.

The method of manufacturing includes the step 1210 of forming a collector layer 220 having a first conductivity type, the step 1220 of forming a first layer 241 of a base region 240 having a second conductivity type opposite to the first conductivity type, and the step 1230 of forming a second layer 242 on the first layer 241 of the base region 240. The first layer 241 has a first doping concentration being higher than a second doping concentration of the second layer 242. The first layer 241 is disposed on the collector layer 220. Further, the method includes the step 1240 of forming an emitter layer 260 disposed on the second layer 242 and the step 1250 of forming a mesa in the emitter layer 260 and at least part of the base region 240. The emitter layer 260 has the first conductivity type. The steps of forming layers may preferably include epitaxial growth of SiC.

For the purpose of forming the mesa, the method may include the substeps of forming a masking layer on the emitter layer, patterning the masking layer and etching the emitter layer and the second layer of the base layer.

Figure 13:
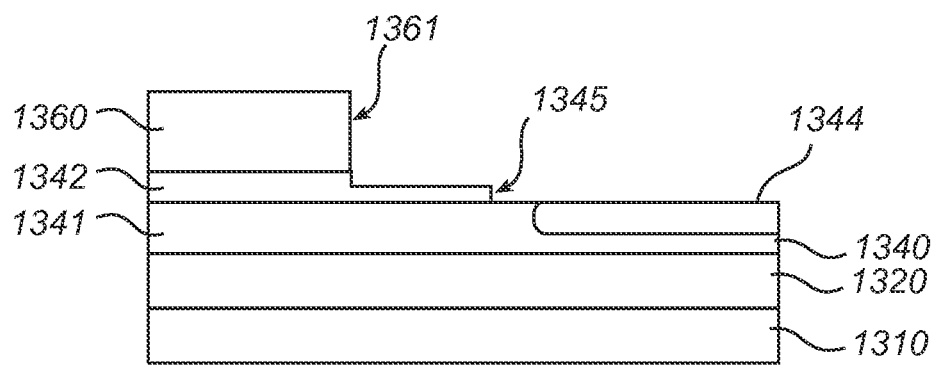
FIG. 13 shows a schematic cross-sectional view of a SiC BJT in accordance with another exemplifying embodiment.

With reference to FIG. 13, a BJT in accordance with another embodiment is described. The BJT shown in FIG. 13 is identical to the BJT described with reference to FIG. 2, the BJT comprising a substrate 1310 on which a collector layer 1320, a base layer 1340 and an emitter layer 1360 are disposed. The base layer comprises a first layer 1341 having a first doping concentration and a second layer 1342, disposed on the first layer 1341, having a second doping concentration being lower than the first doping concentration. A mesa having a sidewall 1361 is formed in the emitter layer to define the emitter region 1360. As mentioned above, the sidewall may extend into the second layer 1342 of the base region 1340 and may optionally terminate within this second layer 1342, as shown in FIG. 13. Using subsequent processing steps of lithography in a masking layer and etching via e.g. plasma etch, an additional wall 1345 may be formed in the second layer 1342 such that the second layer extend only partially over the surface of the device. In the present embodiment, the second layer 1342 extends only within a part of the extrinsic base region. It is preferable that the second layer 1342 extends at least some micrometers in the extrinsic base region. Such a configuration facilitates the formation of the base contact via an implanted region 1344 directly reaching the first layer 1341 of the base region 1340.

Figure 14:
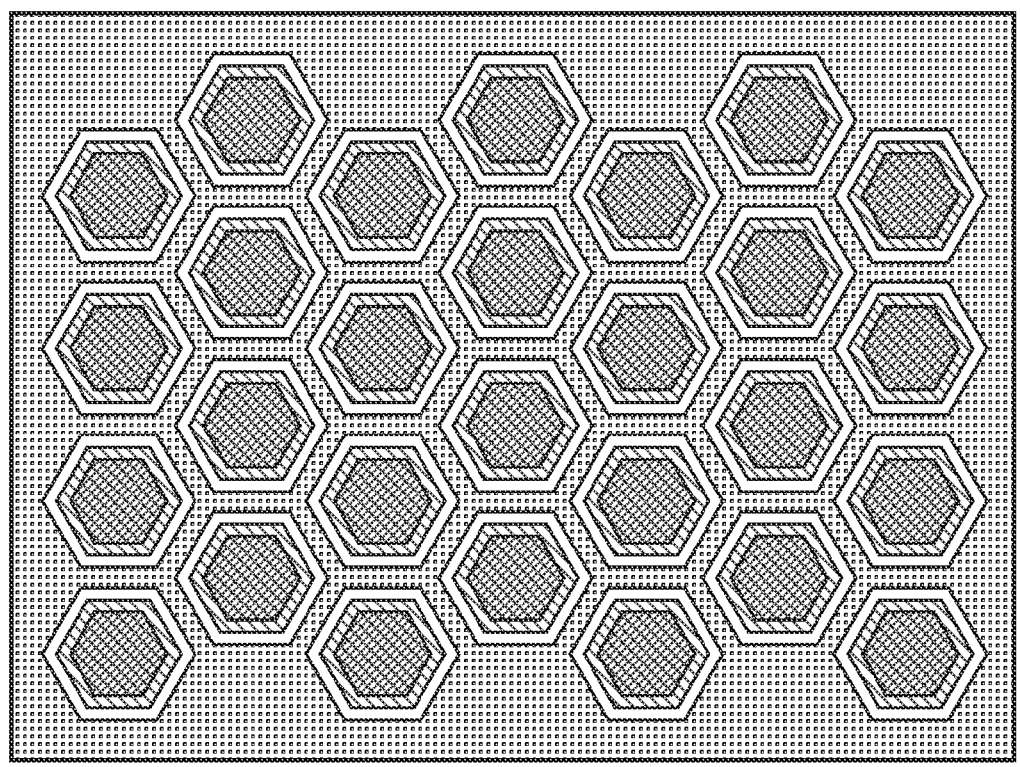
FIG. 14 shows an arrangement with a two-dimensional array of unit cells of a power BJT according to an embodiment.

As shown in FIG. 14, a power BJT may be arranged as a two-dimensional array of BJT unit cells. One way of forming such an array is fabrication of emitter mesas 1460 as hexagons (from a top view) and arranging the emitter mesas in a hexagonal close-pack array, as shown in FIG. 14. Ohmic emitter contacts 1463 may be arranged in the central part of each emitter mesa hexagon, whereas the base Ohmic contacts 1445 form a continuous honeycomb pattern. Emitter and base contact pads may be arranged using standard multi-level metal interconnections (not shown).

According to an alternative embodiment, the two-dimensional array of BJT unit cells may be arranged with reversed polarity of emitter mesas with respect to the arrangement shown in FIG. 14. In the present embodiment, the emitter mesa may be shaped as a honeycomb web (from a top view). According to yet another embodiment, the two-dimensional array of BJT unit cells may be arranged utilizing a rectangular pattern.

While specific embodiments have been described, the skilled person will understand that various modifications and alterations are conceivable within the scope as defined in the appended claims.

What is claimed is:

1. A silicon carbide (SiC) bipolar junction transistor (BJT), comprising:
   a collector region of n-type conductivity;
   a base region of p-type conductivity; and an emitter region of n-type conductivity;

the collector region, the base region and the emitter region being disposed as a stack, the emitter region and a part of the base region forming a mesa, the part of the base region being capped by the emitter region and including a first portion having a first doping concentration and a second portion having a second doping concentration lower than the first doping concentration, the second portion being vertically stacked between the first portion and the emitter region.

2. The SiC BJT of claim 1, wherein the first portion is included in a first layer of the base region and the second portion is included in a second layer of the base region, the second layer being vertically arranged closer to the emitter region than the first layer is vertically arranged with respect to the emitter region.

3. The SiC BJT of claim 1, wherein the second doping concentration is, at most, 50% of the first doping concentration.

4. The SiC BJT of claim 1, wherein the second doping concentration has a value between approximately 5% to 25% of a value of the first doping concentration.

5. The SiC BJT of claim 1, wherein the base region has a doping level decreasing in a graded manner or a stepwise manner along a direction from the collector region to the emitter region.

6. The SiC BJT of claim 1, wherein the second portion has a thickness less than a thickness of the first portion.

7. The SiC BJT of claim 1, wherein the second portion of the base region has a thickness between approximately 30 to 500 nm.

8. The SiC BJT of claim 1, wherein the emitter region has a thickness approximately between 0.3 to 3 µm.

9. The SiC BJT of claim 1, wherein the mesa includes a sloped sidewall.

10. The SiC BJT of claim 1, wherein the mesa includes a sidewall extending at least partly into the second portion.

11. The SiC BJT of claim 1, wherein the mesa includes a sidewall terminating within the second portion.

12. The SiC BJT of claim 1, wherein the base region has a total dose of approximately $2\text{-}4\times10^{13}$ cm$^{-2}$.

13. The SiC BJT of claim 1, wherein the emitter region, the base region and the collector region are disposed on a 4-hexagonal substrate having an off-axis orientation of about 4 degrees or lower of the (0001) crystal plane, the SiC BJT further comprising a defect termination layer (DTL) arranged between the substrate and the collector region.

14. The SiC BJT of claim 13, wherein the DTL has a doping level in a range of approximately $3\times10^{18}$ to $2\times10^{19}$ cm$^{-3}$.

15. The SiC BJT of claim 1, further comprising an ion-implanted region laterally spaced away from a sidewall of the mesa, the ion-implanted region defining a contact zone to the base region, the ion-implanted region having a penetration depth exceeding a thickness of the second portion.

16. The SiC BJT of claim 15, wherein the lateral spacing between the ion-implanted region and the sidewall of the mesa is at least 2 micrometers.

17. The SiC BJT of claim 1, wherein the SiC BJT is a first SiC BJT included in a SiC power device including an array with a second SiC BJT, the first SiC BJT being connected to the second SiC BJT via an interconnect.

18. A silicon carbide (SiC) semiconductor device, comprising:

a first region having an n-type conductivity;

a second region having a p-type conductivity, the second region including a first portion having a first doping concentration and a second portion having a second doping concentration lower than the first doping concentration, the second portion being vertically arranged on the first portion; and a third region having an n-type conductivity, the first region, the second region, and the third region being disposed as a stack, the third region and a part of the second region forming an elevated structure.

19. The SiC semiconductor device of claim 18, wherein the first portion of the second region is arranged adjacent to the third region, and the second portion of the second region is arranged adjacent to the first region.

20. A silicon carbide (SiC) semiconductor device, comprising:

a collector region having an n-type conductivity;

a first layer disposed on the collector region, the first layer having a first doping concentration;

a second layer disposed on the first layer, the first layer and the second layer each having a p-type conductivity, the second layer having a second doping concentration lower than the first doping concentration;

an emitter region disposed on the second layer, the emitter region having an n-type conductivity; and a wall extending through the emitter region and at least a part of the second layer.

21. The SiC semiconductor device of claim 20, wherein the second layer includes an overetch.

22. The SiC BJT of claim 1, wherein the part of the base region is an intrinsic part of the base region.

\* \* \* \* \*